United States Patent [19]

Shiga

[11] Patent Number: 5,248,947

[45] Date of Patent: Sep. 28, 1993

[54] MICROWAVE OSCILLATOR HAVING MICROSTRIP ANTENNA FOR TEST PURPOSES

[75] Inventor: Nobuo Shiga, Yokohama, Japan

[73] Assignee: Sumitomo Electric Industries, Ltd., Osaka, Japan

[21] Appl. No.: 871,704

[22] Filed: Apr. 21, 1992

[30] Foreign Application Priority Data

Apr. 26, 1991 [JP] Japan ................................. 2-96893

[51] Int. Cl.$^5$ ................ H03B 5/18; G01R 31/302; H01Q 3/26

[52] U.S. Cl. ................................. 331/44; 324/501; 331/74; 331/99; 331/107 SL; 331/117 D; 343/700 MS; 455/129

[58] Field of Search .............. 331/96, 99, 64, 74, 331/44, 107 SL, 117 D; 324/501; 343/700 MS; 455/67.5, 115, 129

[56] References Cited

U.S. PATENT DOCUMENTS 4,731,611 3/1988 Müller et al. ................ 331/107 SL
4,736,454 4/1988 Hirsch ............................ 331/117 D

FOREIGN PATENT DOCUMENTS 296838 12/1988 European Pat. Off. .
2-132904 5/1990 Japan ............................... 331/96

OTHER PUBLICATIONS

Patent Abstracts of Japan, vol. 10, No. 113 (E-399) 26 Apr. 1986 & JP-A-60 248 007 (Fujitsu KK).
Patent Abstracts of Japan, vol. 015, No. 121 (E-1049) 25 Mar. 1991 & JP-A-3 009 602.
Philip G. Wilson et al, "An Easy-To-Use FET DRO Design Procedure Suited To Most CAD Programs", IEEE MTT-S Digest, pp. 1033-1036 (1989).
Keither R. Carver, et al, "Microstrip Antenna Technology", IEEE Trans. Antennas Propagat., vol. AP-29, No. 1, pp. 13-34 (1981).

Primary Examiner—Siegfried H. Grimm
Attorney, Agent, or Firm—Beveridge, DeGrandi, Weilacher & Young

[57] ABSTRACT

An oscillating apparatus comprising: an oscillator unit for oscillating in the microwave band; an output unit electromagnetically coupled to the outputting unit of the oscillator unit for taking an oscillation output outside; and an antenna element electromagnetically coupled to a part of the outputting unit, or a part of the output unit for radiating part of the oscillation output in an electromagnetic wave.

11 Claims, 3 Drawing Sheets

MICROWAVE OSCILLATOR HAVING MICROSTRIP ANTENNA FOR TEST PURPOSES

BACKGROUND OF THE INVENTION

1. Field of the Invention

This invention relates to a local oscillating apparatus for use in converters and measuring apparatuses for satellite broadcasting receivers.

2. Related Background Art

The recent rapid development of the information network systems has accompanied the rapid increase of the demand for satellite broadcasting and broadcasting systems. Higher frequency bands are increasingly required. There is thus a demand for oscillators which are used as local oscillators in down-converters for converting high frequency signals to lower frequency signals.

Conventionally there has been no means for confirming in a non-contact manner with the oscillators of such purpose as to test the presence of their oscillation, and oscillation frequencies and outputs. In tests for such confirmation, the output terminals of the oscillators are physically connected to the input terminals of the measuring apparatuses.

As described above, in the conventional oscillators as converters for satellite broadcasting receivers, tests for the presence of their oscillation, their oscillation frequencies and outputs are conducted by physically connecting the oscillators to measuring apparatuses. In these tests, the loads of the oscillators are the measuring apparatuses, and their impedance is 50Ω. In usual applications, loads of the oscillators are, e.g., mixers, and their impedance is not 50Ω. But, once actual loads, such as mixers, have been connected, the above-mentioned measurement cannot be conducted.

SUMMARY OF THE INVENTION

An object of this invention is to provide an oscillating apparatus which can accurately measure its oscillation frequencies and the presence of oscillation output without physically connecting the input terminal of a measuring apparatus.

The oscillating apparatus according to this invention includes an antenna element electromagnetically coupled to a part of the output of an oscillator unit or to a part of an outputting unit. As long as the oscillator unit is a microwave-band oscillator unit using a GaAs FET, the oscillator unit may be an MMIC (Microwave Monolithic Integrated Circuit) having necessary devices, such as a FET, integrated on one semi-insulating GaAs substrate, or a microwave HIC (Hybrid Integrated Circuit) which is an assembly of a GaAs FET and other devices which are discrete from one another.

Part of the output energy of the oscillator unit is taken out to be coupled to the antenna element. The energy electromagnetically radiated from the antenna element into the air is measured, and an oscillation state in actual use of the oscillator unit can be measured.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

DESCRIPTION OF THE PREFERRED EMBODIMENT

Figure 1:
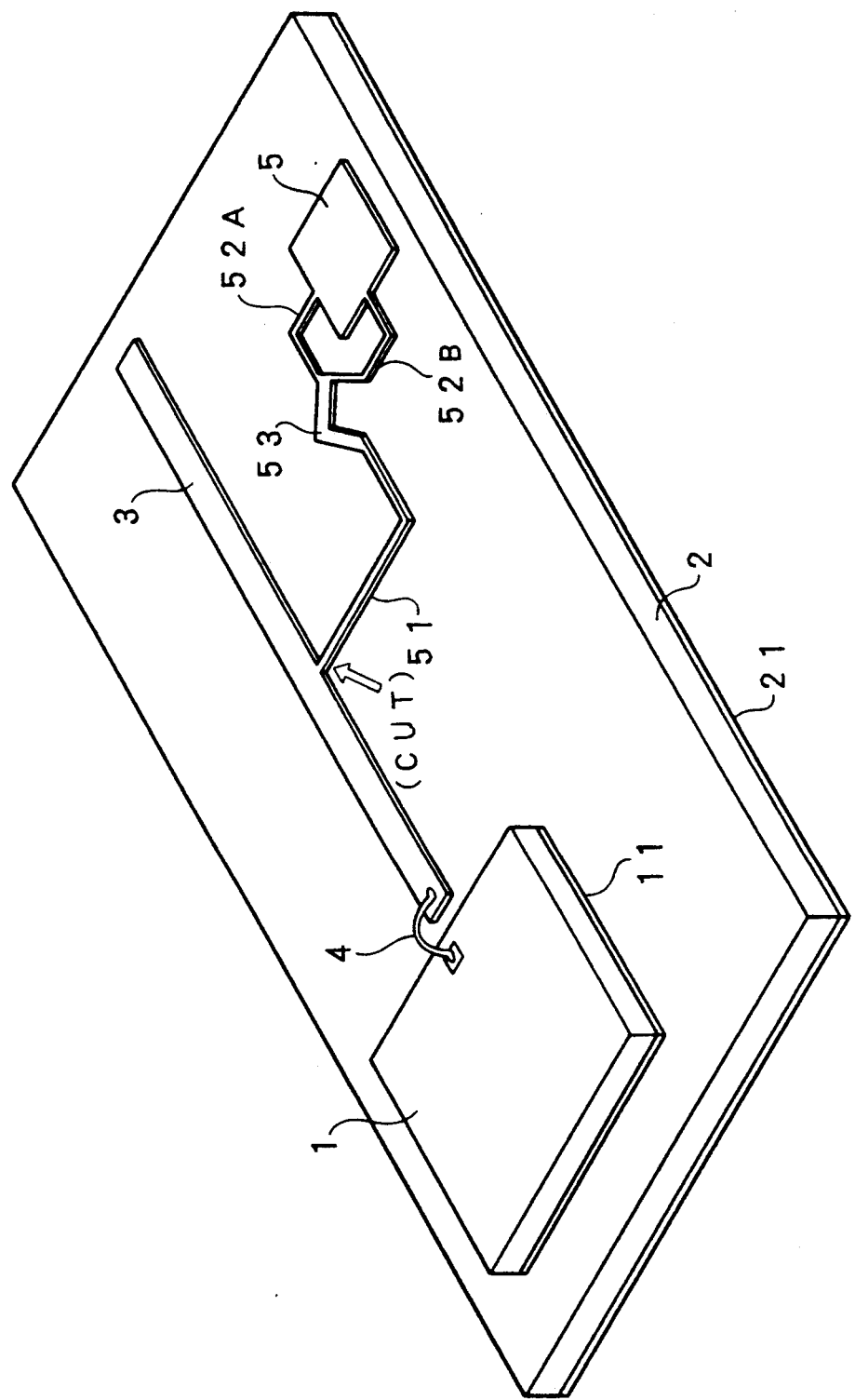
FIG. 1 is a perspective view of the oscillating apparatus according to a first embodiment of this invention.

A first embodiment of this invention is shown in FIG. 1. An MMIC oscillator unit 1 has all the elements necessary for an oscillator unit, such as a FET (Field Effect Transistor), a resistor, a condenser, an inductor, etc. integrated on one chip. The respective layers are grown on a semi-insulating GaAs substrate by OMVPE (Organic metallic Vapor Phase Epitaxy). The FET of this embodiment is a Schottky gate MESFET (Metal Semiconductor FET).

The chip of the oscillator unit 1 is diebonded to a ceramic substrate 2 through a metal layer 11. An Au wire 4 interconnects a microstrip line 3 formed on the ceramic substrate 2 and the output terminal (electrode pad) of the oscillator unit 1. In this embodiment, the microwave oscillating unit and outputting unit are provided by the chip of the oscillator unit, and the outputting unit includes the output terminal. An antenna element 5, which is a usual antenna element, is coupled to the microstrip line 3 on the substrate 2. It is preferable that one side of the square patch of the antenna element 5 is ½ a wavelength of an oscillation frequency on the GaAs substrate.

This embodiment will be explained in more detail. The microstrip line 3 is an output unit for taking out an oscillation output to an outside circuit (not shown). An elongate conducting film 51 for dividing an oscillation output is directly coupled to the middle part of the microstrip line 3. The antenna element 5 in the form of a square patch is connected at two orthogonally contacting sides thereof respectively to elongate conducting films 52A, 52B. These conducting films 52A, 52B are connected to the conducting film 51 through a conducting film 53. In this arrangement, the conducting film 53 functions to match impedances. The two branched conducting films 52A, 52B so function that the antenna element 5 radiates a circularly polarized electromagnetic wave. A metal layer 21 is formed on the entire back surface of the ceramic substrate 2 and is grounded.

In this embodiment an oscillation state of the MMIC is measured in the following operation. When a current is supplied to the oscillator unit 1, an oscillation output is supplied to the microstrip line 3 through the wire 4. Part of the oscillation output is supplied to the antenna element 5 through the conducting films 51, 53, 52A, 52B and is electromagnetically radiated into the air. A receiver antenna (not shown) of a measuring apparatus is positioned opposite to the antenna element 5, and the output and the oscillation frequency of the oscillator unit 1 can be measured in non-contact.

This measurement can be performed with an outside circuit (not shown) connected to the microstrip line 3. When the antenna element is coupled, naturally the antenna element functions as a load of the output of the oscillator unit 1. It is necessary to design the antenna element not to be an excessively heavy load. But the load can be removed by cutting the conducting film 51 at a part indicated by the arrow "CUT" in FIG. 1 after a measurement. The load can be easily cut off by the application of a laser beam.

Figure 2:
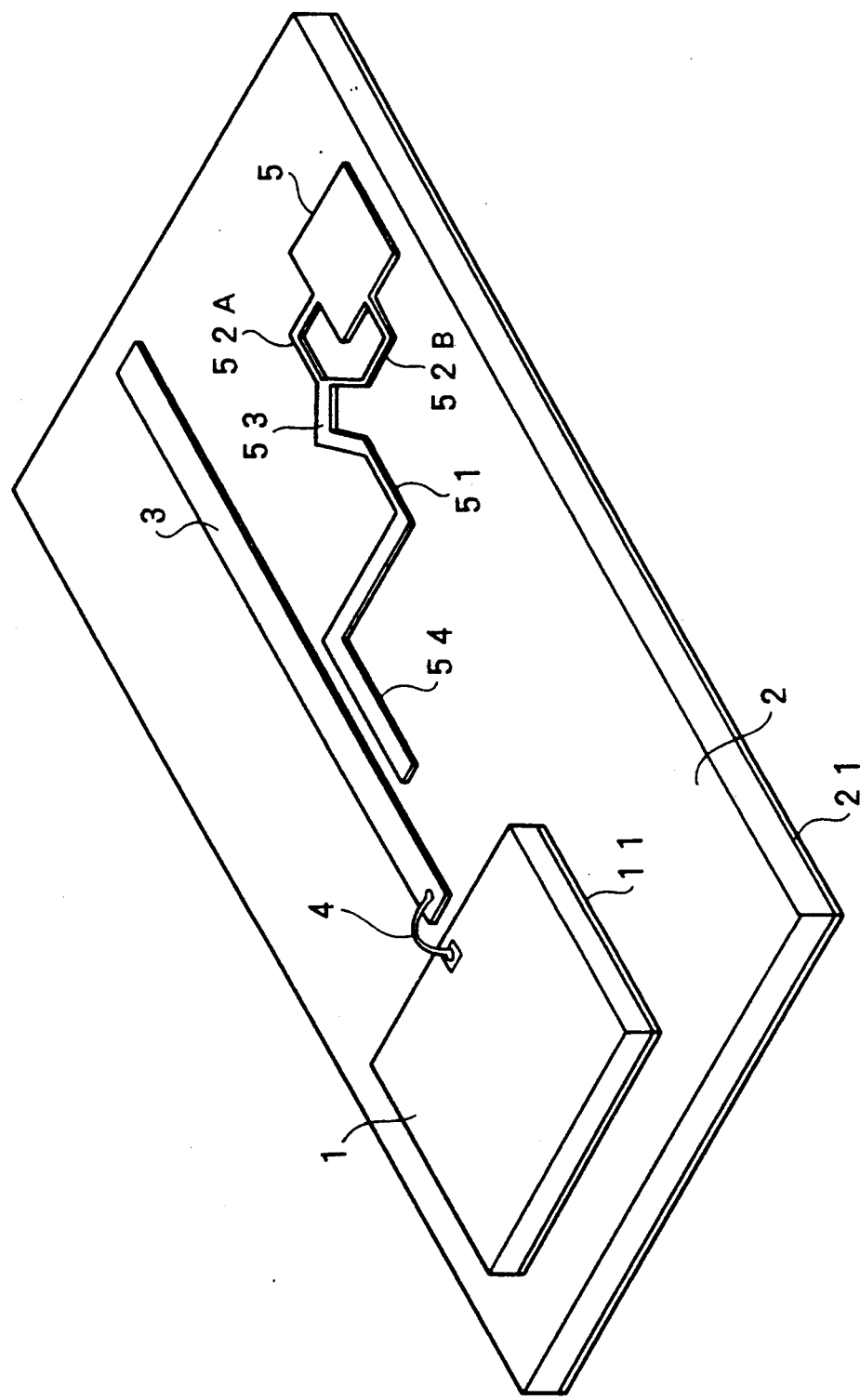
FIG. 2 is a perspective view of the oscillating apparatus according to a second embodiment of this invention.

A second embodiment of this invention is shown in FIG. 2. This embodiment is different from the first embodiment in the coupling of the antenna to the microstrip line 3. The common reference numerals of FIG. 2 with FIG. 1 indicate common members. In this embodiment, the antenna element 5 is not coupled directly to the microstrip line 3, but connected with a gap. It is preferable that the coupling part 54 has a length L ¼ of an oscillation wavelength $\lambda_g$.

In the above-described embodiments, the antenna element is provided by a square patch antenna, which is one type of microstrip antenna. But, as is well known, the patch may have various shapes, and it is needless to say that the patch is not limited to squares. A line-shaped or a spiral antenna other than patch antennas can be optionally used as the antenna element.

It is possible that the microstrip line 3 and the antenna element 3 are monolithically integrated on the semi-insulating GaAs substrate with an oscillator unit formed thereon, or on a MMIC converter with an oscillator unit and a mixer or other circuits integrated together. Consequently an oscillation state from actual use of the oscillator unit can be measured in non-contact.

Figure 3:
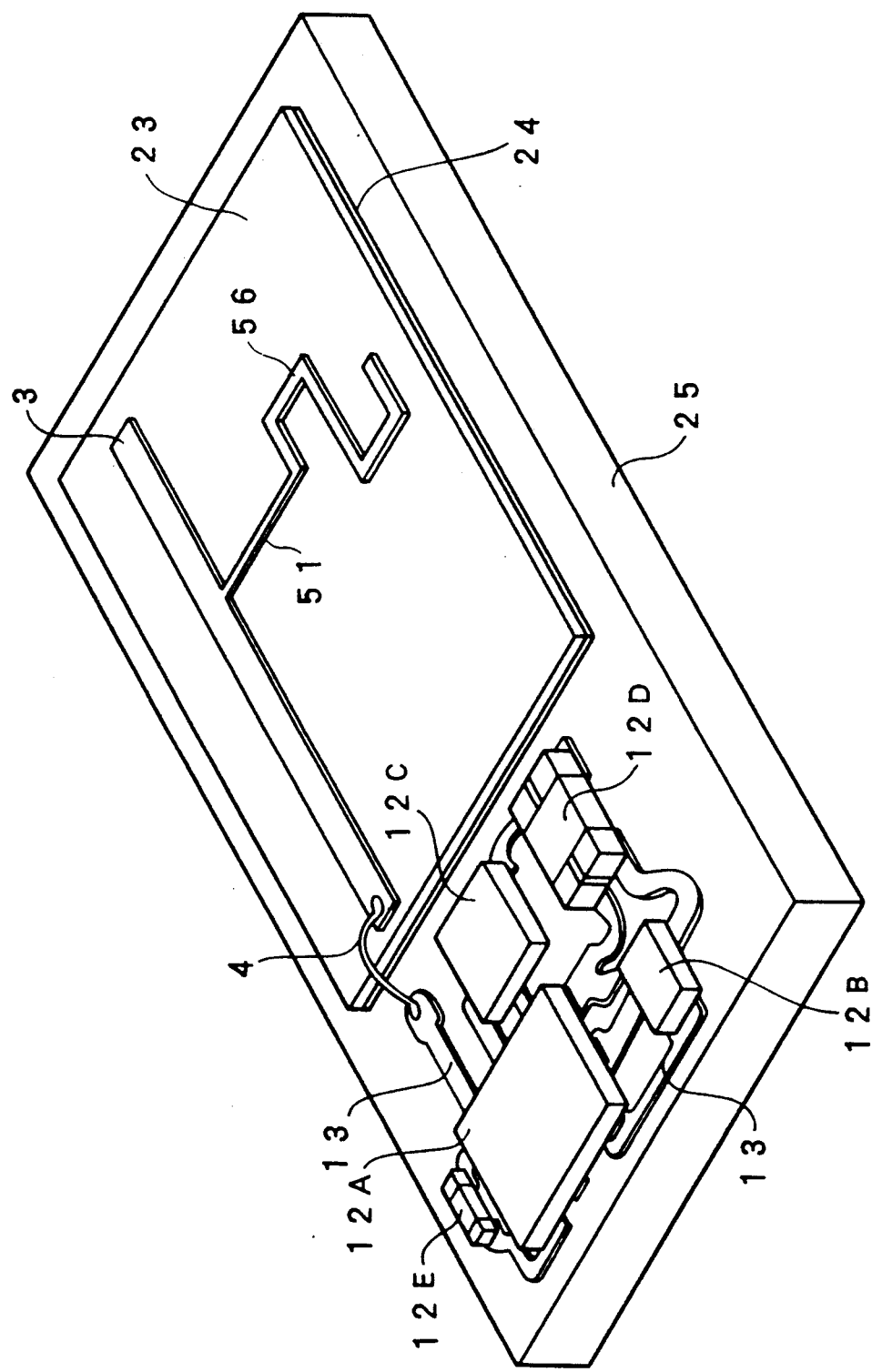
FIG. 3 is a perspective view of the oscillating apparatus according to a third embodiment of this invention.

A third embodiment of this invention is shown in FIG. 3. In this embodiment, the microwave oscillating unit and outputting unit are provided by a microwave hybrid integrated circuit (HIC) oscillator unit. On a ceramic substrate there are mounted a GaAs IC chip 12A, and various chips 12B, 12C, 12D, 12E, such as a resistor, a condenser, an inductor, etc., and these chips are connected by a metal film 13. The output terminal of the oscillator unit is connected to a microstrip line 3 by the wire 4.

The microstrip line 3 is coupled to a line-shaped antenna element 56 through a conducting layer 51. These microstrip type elements 3, 51, 56 are formed on a thin dielectric substrate 23. Between this dielectric substrate 23 and the ceramic substrate 2 is sandwiched a grounded metal layer 24. Generally the dielectric substrate of a microstrip circuit operable at about 10 GHz is about 150 μm thick, and can be easily broken. In this embodiment, however, the HIC is formed on a thick ceramic substrate, and the thin dielectric substrate 23 is bonded to the ceramic substrate through the metal film 24, so that the high frequency characteristics of the microstrip circuit are improved.

The claims of this application cover not only the above-described embodiments but also the following examples. In the oscillating apparatus involved in this invention, an output of the oscillator unit is taken outside through the output unit while part of the output is led to the antenna element to be electromagnetically radiated into the air. There are various examples of especially the arrangement for taking out an oscillation output to the antenna element.

For example, as in the above-described embodiments, the antenna element may be coupled to the microstrip line, which is an output unit. The antenna element may be electromagnetically coupled to the output terminal, which is a part of the outputting unit, of the microwave oscillator unit. The coupling may be by a wire or may be electromagnetical in non-contact at a $\lambda_g/2$ coupling length.

The antenna element may be coupled to a part of the outputting unit of the microwave oscillator device. Generally a microwave oscillator unit has an output, and this outputting unit includes a MESFET. In the case the drain electrode of this MESFET is electromagnetically coupled to the output unit (microstrip line), the source electrode of this MESFET is electromagnetically coupled to the antenna element, and the constitution of this invention can be realized.

As described above, in the microwave-band oscillator device using a GaAs FET according to this invention, an oscillation state in actual use of the device can be measured in non-contact by coupling the antenna element to a part of the output unit.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

I claim:

1. An oscillating apparatus comprising:
   on oscillator unit having an output terminal for outputting an oscillation signal in the microwave band;
   a microstrip line physically and electrically connected to said output terminal, the microstrip line being adapted for providing physical and electrical connection to an external circuit; and
   an antenna means including an antenna element for radiating a part of the oscillation signal by way of an electromagnetic wave, and a coupling part which electrically connects the antenna element to the microstrip line, the coupling part being physically separated from the microstrip line by a gap.

2. An oscillating apparatus according to claim 1, wherein the oscillator unit is a microwave monolithic integrated circuit having devices including a MESFET integrated on a semi-insulating GaAs substrate.

3. An oscillating apparatus according to claim 1, wherein the oscillator unit is a microwave hybrid integrated circuit having a plurality of chips including a GaAs MESFET chip arranged and wired with one another on an insulating substrate.

4. An oscillating apparatus according to claim 1, wherein the coupling part has a length substantially one-fourth of a wavelength of said oscillation signal at an intended operating frequency of said apparatus.

5. An oscillating apparatus according to claim 1, wherein the antenna element is a microstrip antenna.

6. An oscillating apparatus according to claim 1, wherein the antenna element is a microstrip antenna electromagnetically coupled to the microstrip line.

7. An oscillating apparatus according to claim 1, wherein the antenna element is a second microstrip line and a microstrip antenna which are of a thin conducting film formed on a single dielectric substrate.

8. An oscillating apparatus according to claim 1, wherein a GaAs chip constituting the oscillator unit is mounted on the top surface of a dielectric substrate having a conducting layer formed on the underside, and the microstrip line is formed on the dielectric substrate.

9. An oscillating apparatus according to claim 8, wherein a microstrip antenna constituting the antenna element is formed on the top surface of the dielectric substrate.

10. An oscillating apparatus according to claim 1, wherein a GaAs chip constituting the oscillator unit is mounted on the top surface of an insulating substrate; a dielectric substrate having a conducting layer formed on the underside is mounted on the top surface of the insulating substrate; and the microstrip line is formed on the dielectric substrate.

11. An oscillating apparatus according to claim 10, wherein a microstrip antenna constituting the antenna element is formed on the top surface of the dielectric substrate.

* * * * *